(12) United States Patent
Scott et al.

(10) Patent No.: US 7,961,007 B2
(45) Date of Patent: Jun. 14, 2011

(54) RECEIVER TO MATCH DELAY FOR SINGLE ENDED AND DIFFERENTIAL SIGNALS

(75) Inventors: Gregory S. Scott, Santa Clara, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/433,823

(22) Filed: Apr. 30, 2009

(65) Prior Publication Data

US 2010/0279645 A1 Nov. 4, 2010

(51) Int. Cl.
*H03K 19/094* (2006.01)
*H03K 19/0175* (2006.01)

(52) U.S. Cl. .............. 326/86; 326/90; 326/82; 326/83

(58) Field of Classification Search .............. 326/86, 326/90, 115, 126–127
See application file for complete search history.

(56) References Cited

U.S. PATENT DOCUMENTS

| | | | |
|---|---|---|---|
| 5,243,623 A * | 9/1993 | Murdock | 375/220 |
| 5,736,871 A | 4/1998 | Goto | |
| 7,030,665 B2 * | 4/2006 | Takeuchi | 327/112 |
| 7,091,741 B2 * | 8/2006 | Kim | 326/24 |
| 7,127,003 B2 * | 10/2006 | Rajan et al. | 375/286 |
| 7,514,968 B1 | 4/2009 | Lai et al. | |
| 7,639,167 B2 | 12/2009 | Tsuchi | |
| 2005/0046472 A1 | 3/2005 | Kim | |
| 2007/0079147 A1 * | 4/2007 | Pyeon et al. | 713/300 |

OTHER PUBLICATIONS

International Search Report for PCT/US2010/031629 mailed on Oct. 15, 2010, 10 pages.

* cited by examiner

*Primary Examiner* — Anh Q Tran
(74) *Attorney, Agent, or Firm* — Lawrence J. Merkel; Meyertons, Hood, Kivlin, Kowert & Goetzel, P.C.

(57) ABSTRACT

In one embodiment, a receiver circuit is provide that may receive either a differential input or a single-ended input corresponding to an interface. The receiver circuit may include at least two current sources to control a gain of an amplification stage in the receiver. If the receiver circuit is receiving a differential input, one of the current sources may be used. If the receiver circuit is receiving a single-ended input, both of the current sources may be used. A larger gain may thus be provided for the single-ended input as compared to the differential input.

20 Claims, 3 Drawing Sheets

RECEIVER TO MATCH DELAY FOR SINGLE ENDED AND DIFFERENTIAL SIGNALS

BACKGROUND

1. Field of the Invention

This invention is related to the field of integrated circuits and, more particularly, to receiver circuits in integrated circuits.

2. Description of the Related Art

Integrated circuits generally include core circuitry that implements the operation for which the integrated circuit is designed, driver circuitry to drive output signals from the integrated circuit to external circuitry, and receiver circuits to receive input signals from external circuitry. The driver/receiver circuitry buffers and isolates the core circuitry from the external circuitry, handling the larger loads, higher current flows, higher voltages, noise, etc. involved in external communication.

Originally, the core circuitry operated with the same power supply voltage as the driver/receiver circuitry. However, as semiconductor fabrication technology continued to evolve and transistor feature sizes continued to be reduced, the core circuitry eventually required power supply voltages lower than those that could be used for communicating with the external circuitry. In some cases, backward compatibility with legacy external circuitry that was not manufactured using the most advanced semiconductor fabrication technology was desired. In other cases, a higher communication voltage is required by the effects of noise and other factors that affect the reliability of external communications.

Additionally, to support high speed interfaces, improve power characteristics, and/or to improve noise handling, some integrated circuit interfaces include differential signaling. In some cases, an interface can permit both differential and non-differential (single-ended) signaling. For example, the mobile double data rate 2 (mDDR2) memory interface (sometimes referred to as the low power DDR2 (LPDDR2) interface) permits single ended data signaling with a differential clock, or vice versa. Configurations that use only differential or only single ended signaling are also supported. Since the data is referenced to the clock, the integrated circuit that receives the data must account for the difference in delay for receiving differential inputs and single-ended inputs. The margin needed for the difference in delays can pressure the timing margins in the integrated circuit.

SUMMARY

In one embodiment, a receiver circuit is provide that may receive either a differential input or a single-ended input corresponding to an interface. The receiver circuit may include at least two current sources to control a gain of an amplification stage in the receiver. If the receiver circuit is receiving a differential input, one of the current sources may be used. If the receiver circuit is receiving a single-ended input, both of the current sources may be used. A larger gain may thus be provided for the single-ended input as compared to the differential input.

In one implementation, the receiver circuit may be designed to provide an approximately equal delay through the receiver for a differential input and a single-ended input. Multiple receiver circuits may be implemented in an integrated circuit for an interface that includes both differential and single ended inputs, and the delays through the receivers may be approximately matched. Accordingly, the signals on the interface may pass through the receiver circuits arrive at internal circuitry within the integrated circuit at approximately the same time, which may ease timing pressures in some embodiments. For example, the interface may include a clock and one or more data lines that are referenced to the clock. The clock may be differential and the data single ended, or vice versa. By ensuring approximately matched delays through the receivers, timing margin pressures in the capture of the data using the clock may be alleviated.

BRIEF DESCRIPTION OF THE DRAWINGS

The following detailed description makes reference to the accompanying drawings, which are now briefly described.

Figure 1:
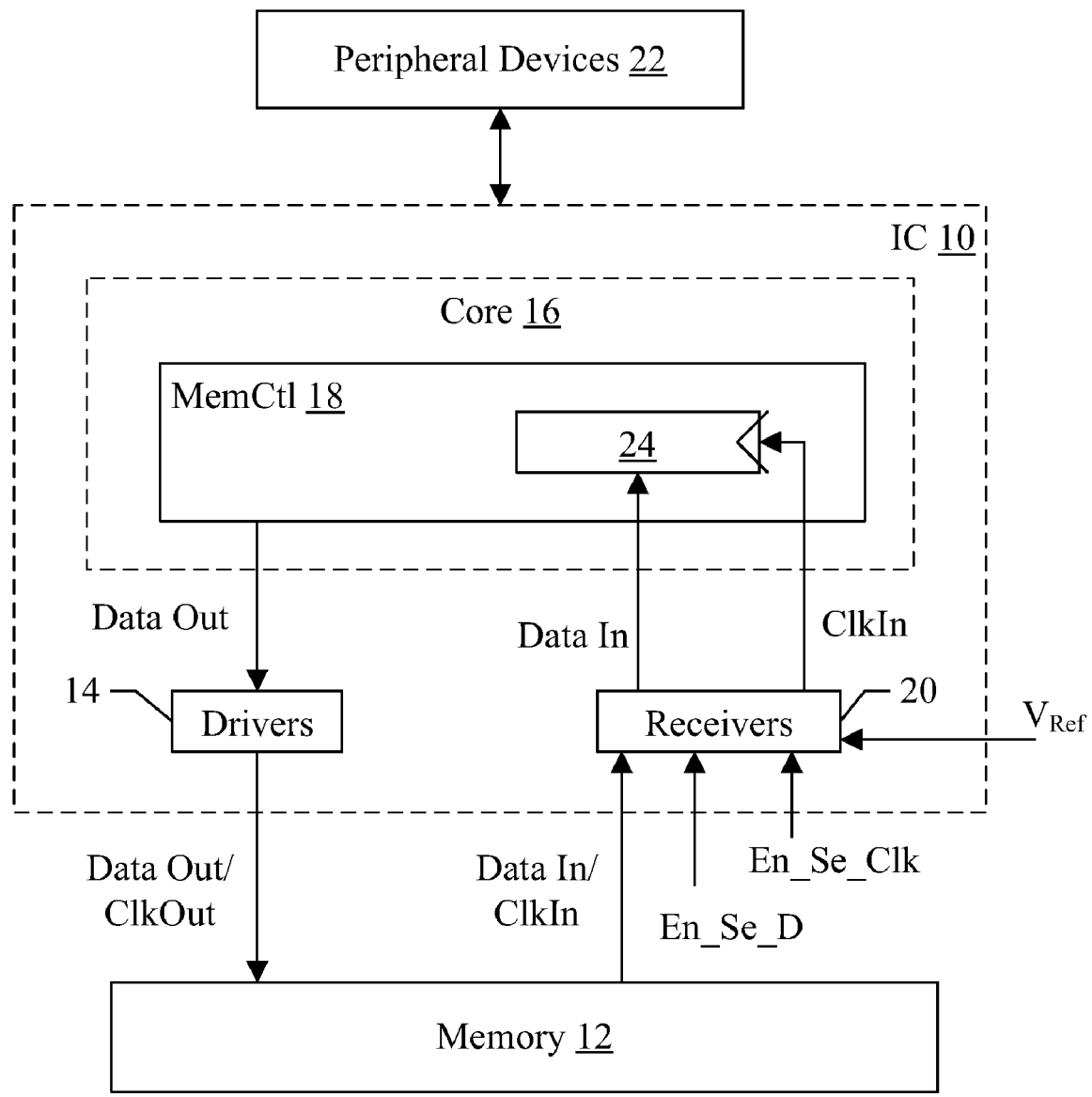
FIG. 1 is a block diagram of one embodiment of a system including an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of a system including one embodiment of an integrated circuit (IC) 10, a memory 12, and one or more peripheral devices 22 is shown. The integrated circuit 10 is coupled to the memory 12 and to the peripheral devices 22.

Specifically, with respect to the memory 12, the integrated circuit 10 may be coupled via one or more conductors forming an output channel and one or more other conductors forming an input channel. Together, the output channel and the input channel may form an interface to the memory. For example, in one embodiment, the memory 12 and the interface may be compliant with the mDDR2 specification. In that specification, each of the input and output channels are formed from one or more data inputs/outputs that are referenced to a clock transmitted by the source of the data. That is, data is sampled from the conductors by the receiving device using the transmitted clock. Accordingly, as shown in FIG. 1, the output channel may comprise one or more data outputs (Data Out) and at least one clock output (ClkOut). Similarly, the input channel may comprise one or more data inputs (Data In) and at least one clock input (ClkIn). In some embodiments, more than one ClkOut or ClkIn may be provided. The data outputs/inputs may be divided into groups referenced to different ones of the ClkOut outputs or ClkIn inputs. Such an arrangement may ease the skew management in the transmitter between the data and the corresponding clock. Additionally, as mentioned previously, the mDDR2 specification permits mixtures of single-ended data inputs and different clock inputs, and vice versa (and also permits the same mixtures for data and clock outputs). Accordingly, in various implementations, a given input may be a single conductor (referenced to a voltage reference $V_{Ref}$ for determining high or low on the single conductor, in the illustrated embodiment) or a pair of conductors on which a differential pair of signals are carried.

Generally, single-ended inputs may be inputs that are represented by a single signal that is referenced to a reference voltage ($V_{Ref}$). If the signal voltage is above $V_{Ref}$, the signal is carrying a logical one. If the signal voltage is below $V_{Ref}$, the signal is carrying a logical zero. On the other hand, differential inputs may be inputs that are represented by a differential pair of signals. The signals may be complementary, and thus a transition toward high on one signal is accompanied by a transition toward low on the other signal. One of the signals may be associated with the true value of the input, and the other may be associated with the complement of the input (or the inverse of the input). The input may be sensed as the difference between the true and complement signals. In various embodiments, differential inputs may permit higher speed signaling, lower power signaling, and/or more resistance to noise on the conductors. Accordingly, a generic reference to an "input" may refer to either a single-ended or differential input. A reference to an "input signal" may refer to the single input signal of a single-ended input or one of the differential pair of signals for a differential input. A similar discussion applies to the outputs described above.

The integrated circuit 10 includes a set of driver circuits 14 to drive the output channel to the memory, and a set of receiver circuits 20 to receive the input channel from the memory. The integrated circuit further includes core circuitry 16, which includes memory controller (MemCtl) 18 to control the memory 12. The memory controller 18 is configured to transmit data out to the drivers 14, which may transmit the data on the Data Out outputs, referenced to the ClkOut output. In other embodiments, the memory controller 18 may also provide the output clock, and the driver circuits 14 may drive the ClkOut output from the output clock. In one embodiment, the output channel may carry packets of data, which may include commands (e.g. read and write commands to the memory) as well as data (e.g. write data for a memory write command). Similarly, the input channel may carry packets of data, including read data for a memory read command. Other embodiments may have explicit address, control, and data outputs, and data inputs.

The receiver circuits 20 are coupled to receive the inputs (Data In and ClkIn) from the memory 12, and to provide the received inputs to the memory controller 18. The receiver circuits 20 may convert the inputs to internal digital signals. For single-ended inputs, the conversion may include generating a sharper transition and possibly level shifting to the voltage domain of the memory controller 18. Alternatively, the level shifting may be performed in the memory controller 18. For differential inputs, the conversion may include recovering a digital signal from the differential pair.

The receiver circuits 20 may each receive an enable signal, which indicates whether the corresponding input is single-ended or differential. For example, in the illustrated embodiment, the enable may be asserted to indicate single-ended and deasserted to indicate differential. Other enable signals may be defined in the opposite fashion. Generally, a control signal such as the enable signal may be considered to be asserted in either the high state or the low state, and deasserted in the other state. In one embodiment, the data inputs may be defined to be single-ended or differential as a group, and thus there may be an enable for the data (En_Se_D in FIG. 1). The receiver circuits that are coupled to receive data inputs may receive the En_Se_D signal. The clock may be separately indicated as single-ended or differential (En_Se_Clk in FIG. 1). The receiver circuit(s) 20 that receive the clock input(s) may receive the En_Se_Clk signal. In some embodiments, if there is more than on ClkIn input and corresponding data signal groups, the differential or single-ended nature of the inputs may be selected on a ClkIn and data group basis. In such embodiments, there may be multiple En_Se_D and En_Se_Clk signals coupled to respective groups of receiver circuits. The receiver circuits 20 may also receive the $V_{Ref}$ input as shown in FIG. 1 for the single-ended signals.

The receiver circuits 20 may use the enable signals to adjust delay through the receiver circuits, attempting to approximately match delay for differential signals (enable deasserted) and single-ended signals (enable asserted). That is, the receiver circuits 20 may attempt to receive and transmit single-ended inputs more rapidly, to match a more rapid reception of the differential inputs. Viewed in another way, the receiver circuits 20 may operate in a lower power mode for differential inputs, and a higher power mode for single-ended inputs that may reduce the delay through the receiver. By matching the delay, timing margin reserved for skew management between data and clock signals may be reduced, in some embodiments.

For example, in FIG. 1, the Data In signals are provided by the receiver circuits 20 to the memory controller 18, and more particularly may be input to a register 24. The received ClkIn may be the clock input to the register 24. If the delay is approximately the same for single ended and differential inputs, the skew between the data and the clock may be limited to approximately the skew permitted on the input interface. It is noted that, on double data rate interfaces, data is transferred in response to both the rising edge and the falling edge of the clock. The register 24 may thus represent one or more registers that can be triggered on the rising edge and/or the falling edge of the clock. In general, the register 24 may comprise any one or more clocked storage devices (e.g. registers, flops, latches, etc.).

The memory controller 18 may include the circuitry to communicate with the memory 12. Additionally, the memory controller 18 may include circuitry to communicate with other components in the core 16. The memory controller 18 may include, for example, queues to store memory requests until the can be transmitted to the memory 12, arbitration and prioritization logic to select among requests to be presented to the memory 12, etc.

The memory 12 may comprise any type of memory. For example, in one embodiment, the memory may be synchronous dynamic random access memory (SDRAM) that complies with the mDDR2 standard (mDDR2 SDRAM). Any other form of synchronous or asynchronous DRAM may be used. Additionally, static RAM may be used, or flash memory or any other volatile or non-volatile memory. In one implementation, one or more memory modules, each containing one or more mDDR2 DRAM chips, may be used to form the memory 12.

The core circuitry 16 may generally comprise the circuitry that implements the operation for which the integrated circuit 10 is designed. For example, if the design includes one or more processors, the core circuitry 16 may include the circuitry that implements the processor operation (e.g. instruction fetch, decode, execution, and result write). The processors may include general purpose processors and/or graphics processors in various embodiments. If the design includes a bridge to a peripheral interface, the core circuitry 16 may include the circuitry that implements the bridge operation. If the design includes other communication features such as packet interfaces, network interfaces, etc., core circuitry 16 may include circuitry implementing the corresponding features. The integrated circuit 10 may generally be designed to provide any set of operations. Generally, the core circuitry 16 may comprise any combination of one or more of the following: memory arrays, combinatorial logic, state machines, flops, registers, other clocked storage devices, custom logic circuits, etc.

While a memory interface is used as an example in which a mixture of differential and single-ended inputs may be supported, other embodiments may have any interface in which a mixture of differential and single-ended inputs are included. The receiver circuits 20 described herein may be used to provide approximately equal delays for single-ended and differential inputs through the receiver circuits. Additionally, other embodiments may implement more than one memory controller and more than one memory. More than one memory may be coupled to the same memory controller, and thus there may be more than one input channel coupled to the same memory controller, in some embodiments.

The peripherals 22 may provide additional functionality for the system, depending on the nature of the system and its intended operation. The system of FIG. 1 may be included in any type of electronic system. For example, the system be a mobile computing device, and the peripheral devices 22 may include various communications devices (e.g. for cell phone communication, wireless (wifi) communication, global position system (GPS) communication, etc.), devices for audio and video playback, user interface devices such as touch screen, microphone, keyboard, etc., general I/O interfaces such as universal serial bus (USB), etc.

In one embodiment, the En_Se_D signal and the En_Se_Clk signal may be fixed (e.g. tied up or down) based on the memory 12 that is included in the system with the integrated circuit 10. In other embodiments, the En_Se_D signal and the En_Se_Clk signal may be programmable (e.g. in a register that may source the signals).

Figure 2:
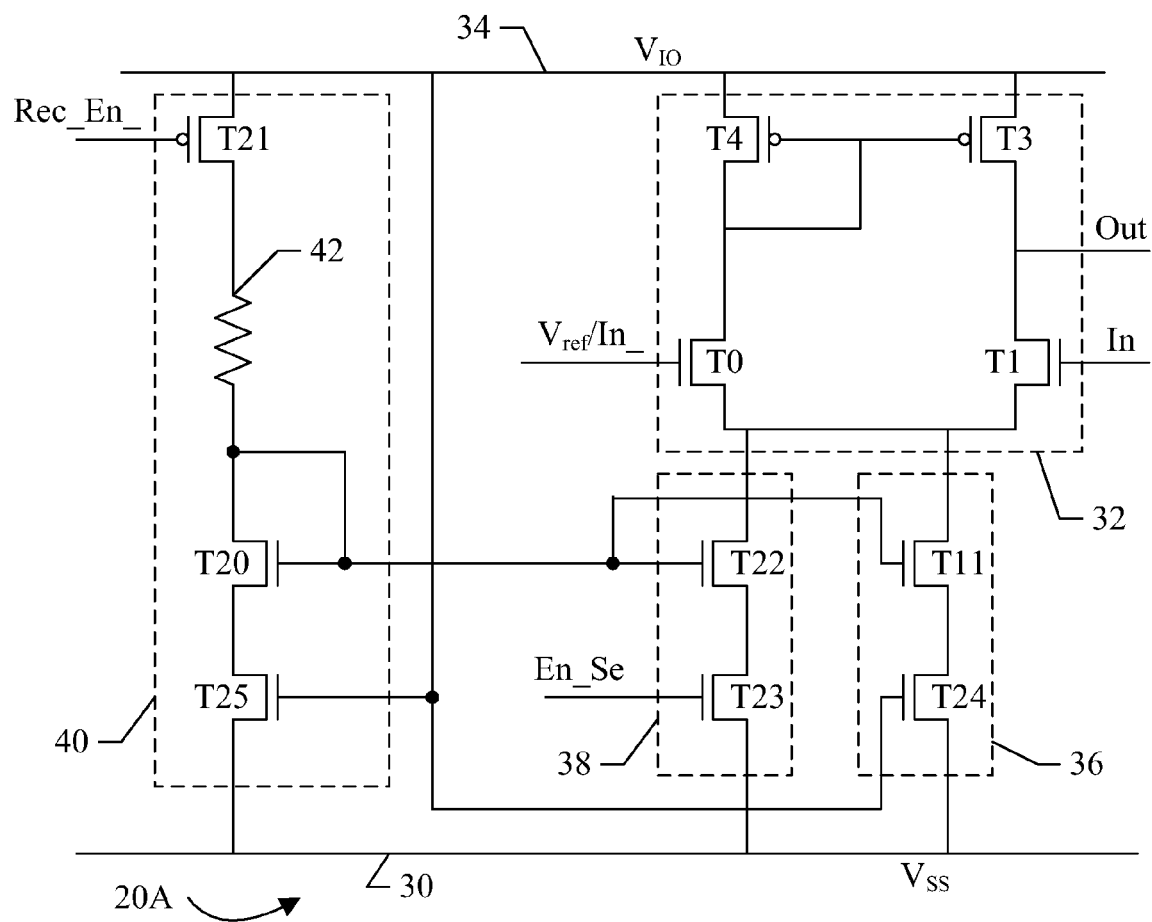
FIG. 2 is a circuit diagram of one embodiment of a receiver circuit that may be used in the integrated circuit of FIG. 1.

Turning now to FIG. 2, a circuit diagram illustrating one embodiment of a receiver circuit 20A is shown. The receiver circuit 20A may be one instance of the receiver circuits 20 shown in FIG. 1, and other receiver circuits 20 may be similar. In the embodiment of FIG. 2, receiver circuit 20A includes various n-type MOS (NMOS) transistors and PMOS transistors. The standard symbols for NMOS transistors (no open circle on the gate terminal, such as the transistor T0) and PMOS transistors (open circle on the gate terminal, such as transistor T3) are used in FIG. 2 to illustrate the circuit. Thus, transistors T0, T1, T11, T20, T22, T23, T24, and T25 are NMOS in this embodiment and the transistors T3, T4, and T21 may be PMOS in this embodiment.

The supply conductors 30 and 34 are powered to the respective voltages $V_{SS}$ and $V_{IO}$ as illustrated in FIG. 2, during use. $V_{SS}$ may be the ground voltage input to the integrated circuit 10, and $V_{IO}$ may be the voltage used on the interface to the memory (or at least may be a voltage that is compatible with the communication on the interconnect). In other embodiments, the conductor 34 may be powered to the $V_{Core}$ voltage used by the core 16, and may perform a level-shifting function on the input as well. In other embodiments, the $V_{Core}$ and $V_{IO}$ voltages may be equal. The supply conductors are intended to carry a relatively stable voltage (as opposed to signal conductors, which carry signals that vary to covey information). While the voltage on the conductors may be subject to variance during use (e.g. voltage droop during high current conditions, noise, etc.), the conductors are nominally held at the desired voltage. For example, the conductors may be electrically connected to the $V_{IO}$ and $V_{SS}$ input pins of the integrated circuit 10.

In the illustrated embodiment, the receiver circuit 20A includes an amplifier stage that may includes an input stage 32 and a pair of parallel current sources 36 and 38. The receiver circuit 20A may also include a bias stage 40 coupled to receive a receiver enable signal (Rec_En_) and coupled to the current sources 36 and 38. The input stage 32 is coupled to receive the input signals corresponding to the input that is received by the circuit, and coupled to provide an output signal corresponding to the received signal (Out). For example, in the embodiment of FIG. 1, the output signal may be one of the Data In signals or the ClkIn signal to the memory controller 18. The input signals may include the true and complement input signals (In and In_, respectively) for a differential input, or the In signal and the $V_{Ref}$ voltage for a single-ended signal. The $V_{Ref}$ voltage may be approximately ½ of the $V_{IO}$ voltage, during use. Alternatively, any other desired magnitude for the reference voltage may be used, having any other relationship to the $V_{IO}$ voltage.

The input stage 32 may generate the output signal Out responsive to the difference between the input signal In and the input signal In_ or the $V_{Ref}$ voltage. That is, the output signal may indicate whether or not the In signal is greater than the In_signal or the $V_{Ref}$ voltage. As illustrated, the input stage 32 includes transistors T0 and T1 having gates coupled to receive the $V_{Ref}$/In_ signal and the In signal, respectively. The sources of the T0 and T1 transistors are connected to each other and to the current sources 36 and 38 as well. The drain of the transistor T0 is connected to the drain of the transistor T4, which has its gate connected to its drain and its source connected to the $V_{IO}$ conductor 34. The gate of the transistor T3 is also connected to the gate of the transistor T4, and the source of the transistor T3 is connected to the conductor 34 as well. The drain of the transistor T3 is connected to the drain of the transistor T1. The output signal is provided from the node at the drains of the transistors T1 and T3.

The transistors T3 and T4 may provide a current mirroring operation for the current through the transistor T0, mirroring a pulldown current in the transistor T0 to a pullup current on the T3, T1 leg of the input stage 32. If the input is differential and is transmitting a binary one, the In signal transitions high and the In_signal transitions low. The transistor T1 is therefore active and is pulling down the output node. The low transition of the In_signal decreases current in the transistor T0 (and may turn off the transistor T0, if the In_signal swings to within a threshold voltage of $V_{SS}$). Thus, the pullup current through the transistor T3 decreases. The output may therefore transition low. Accordingly, the receiver circuit 20A is inverting in this embodiment. In other embodiments, the output may be provided form the node between the transistors T1 and T4, and the receiver circuit 20A may be non-inverting. Similarly, if the input is transmitting a binary zero, the In signal transitions low and the In_signal transitions high. Current through the transistor T0 (and thus through T3) increases, and the current through the transistor T1 decreases. The output may thus transition high.

As can be seen from the above discussion, a transition on a differential input both increases the current flow through one of the transistors T0 and T1 and concurrently decreases the current flow through the other one of the transistors T0 and T1. The total current flow may be limited by the current supplied by the current source 36. The current source 38 is coupled to receive a single-ended enable signal, which is deasserted for a differential input. Accordingly, the gain of the amplifier stage may be proportional to the current supplied by the current source 36.

On the other hand, for the single-ended case, the transistor T0 has a gate that is coupled to an essentially fixed voltage ($V_{Ref}$). The current through T0 is essentially fixed, and thus the current through the transistor T3 is essentially fixed. If the input signal In is lower than $V_{Ref}$, the current through the transistor T1 is less than the current through the transistor T3 and the output will be high. If the input signal In is higher than $V_{Ref}$, the current through the transistor T1 is greater than the transistor T3 and the output will go low. Again, the receiver is inverting in this embodiment for the single ended case. However, if the same amount of current is supplied by the current source 36, the delay through the receiver will be longer in the single-ended case than in the differential case, since only one signal, transistor current is changing in the single ended case.

The second current source 38 may be enabled in the single-ended case, and may also supply current to the input stage in parallel with the current source 36. The total amount of current is increased, increasing the gain of the amplifier stage. The added current may reduce the delay through the receiver circuit 20A for the single-ended case. By sizing the current source 38 to provide an appropriate amount of additional current, the delay through the receiver circuit 20A for the single-ended input may be made approximately equal to the delay for the differential input. For example, if the differential inputs swing from "rail to rail" ($V_{IO}$ to $V_{SS}$) and the single-ended input also swings from rail-to-rail, the current source 38 being sized approximately ⅓ of the size of the current source 36 may approximately match the single-ended delay to the differential delay. That is, the current source 38 may provide approximately ⅓ of the current of the current source 36 for the same bias voltage. Other embodiments may use different sizings of the current source 38 with respect to the current source 36.

The current source 36, in the illustrated embodiment, includes a series connection of the transistor T11 and the transistor T24 between the sources of the transistors T0 and T1 and the $V_{SS}$ conductor 30. Similarly, the current source 38 may comprise a series connection of the transistors T22 and T23 between the sources of the transistors T0 and T1 and the $V_{SS}$ conductor 30. The transistors T11 and T22 have gates coupled to receive the bias voltage from the bias stage 40. The transistor T23 may be coupled to receive the En_Se signal (e.g. the En_Se_D or En_Se_Clk signal shown in FIG. 1, depending on whether the input received by the receiver circuit 20A is a clock or a data input). The transistor T24 may be provided to match the transistor T23, so that the current sources 36 and 38 may have similar electrical characteristics over process, temperature, bias voltage, and supply voltage variations and other variations. The gate of the transistor T24 is coupled to the $V_{IO}$ conductor 34, so that the transistor T24 is active during use.

The receiver circuit 20A may be viewed as having a differential mode and a single-ended mode, where the mode is selected via the En_Se signal. By providing one receiver circuit with two modes and selecting the mode based on the input type, a single receiver circuit may be used for all inputs and the correct mode may be selected based on whether the individual input is single-ended or differential. Since instances of the same circuit are used, ensuring that the timing of the receiver circuits matches may be simplified.

As mentioned above, the bias circuit 40 generates the bias voltage to control the current in the current sources 36 and 38. The bias circuit 40 may be designed to bias the current source 36 to provide sufficient current to provide good duty cycle control for the input in differential mode (i.e. approximately matching rise delay and fall delay on the output of the receiver circuit 20A). The bias circuit includes the transistor T21 coupled to receive a receiver enable signal (Rec_En_). The receiver enable signal may be asserted (low) to enable the receiver circuit 20A to receive signals. Accordingly, during times that the interface to the memory is idle, the receiver circuits 20 may be disabled to conserve power. The transistor T21 has a source connected to the conductor 34 and a drain connected to a resistor 42. The other end of the resistor 42 is connected to the gate and drain of the transistor T20, which has a source coupled to the drain of the transistor T25. The gate of the transistor T25 is connected to the conductor 34, and the source is connected to the conductor 30.

When the Rec_En_signal is asserted, the transistor T21 turns and conducts current. The gate of the transistor T20 rises and the transistor T20 turns on. The current through the transistor T20 continues to increase, increasing the voltage drop across the transistor 42 until a steady state is reached. Once the current in the bias circuit 40 settles, the voltage on the bias output of the bias circuit 40 to the gates of the transistors T22 and T11 may be essentially constant, providing consistent control of the current in the current sources 36 and 38. The transistor T25 is on during use, and is provided (like the transistor T24) to more closely match the electrical characteristics of the current source 38.

The gate of the transistor T0 is illustrated as receiving the In_signal or the $V_{Ref}$ voltage for differential and single-ended inputs, respectively. In one embodiment, there may be a multiplexor or other circuit to couple either the In_signal or the $V_{Ref}$ voltage for each input, depending on whether the input is single-ended or differential. Alternatively, the $V_{Ref}$ voltage may be connected to the In_conductor external to the integrated circuit 10 for single-ended signals.

It is noted that other variations of the circuit are possible as well. For example, the current sources 36 and 38 may be connected between the $V_{IO}$ conductor 34 and the input stage 32, using PMOS transistors instead of NMOS transistors. In such an embodiment, the En_Se signal may be asserted low instead of asserted high.

In one embodiment, the transistors in the receiver circuit 20A may be designed as long channel length devices to improve matching over process variations. In an embodiment, the transistors T3, T4, T11, T20, T22, T23, T24, and T25 may be low threshold voltage transistors, and the transistors T21, T0, and T1 may be regular threshold voltage transistors.

Figure 3:
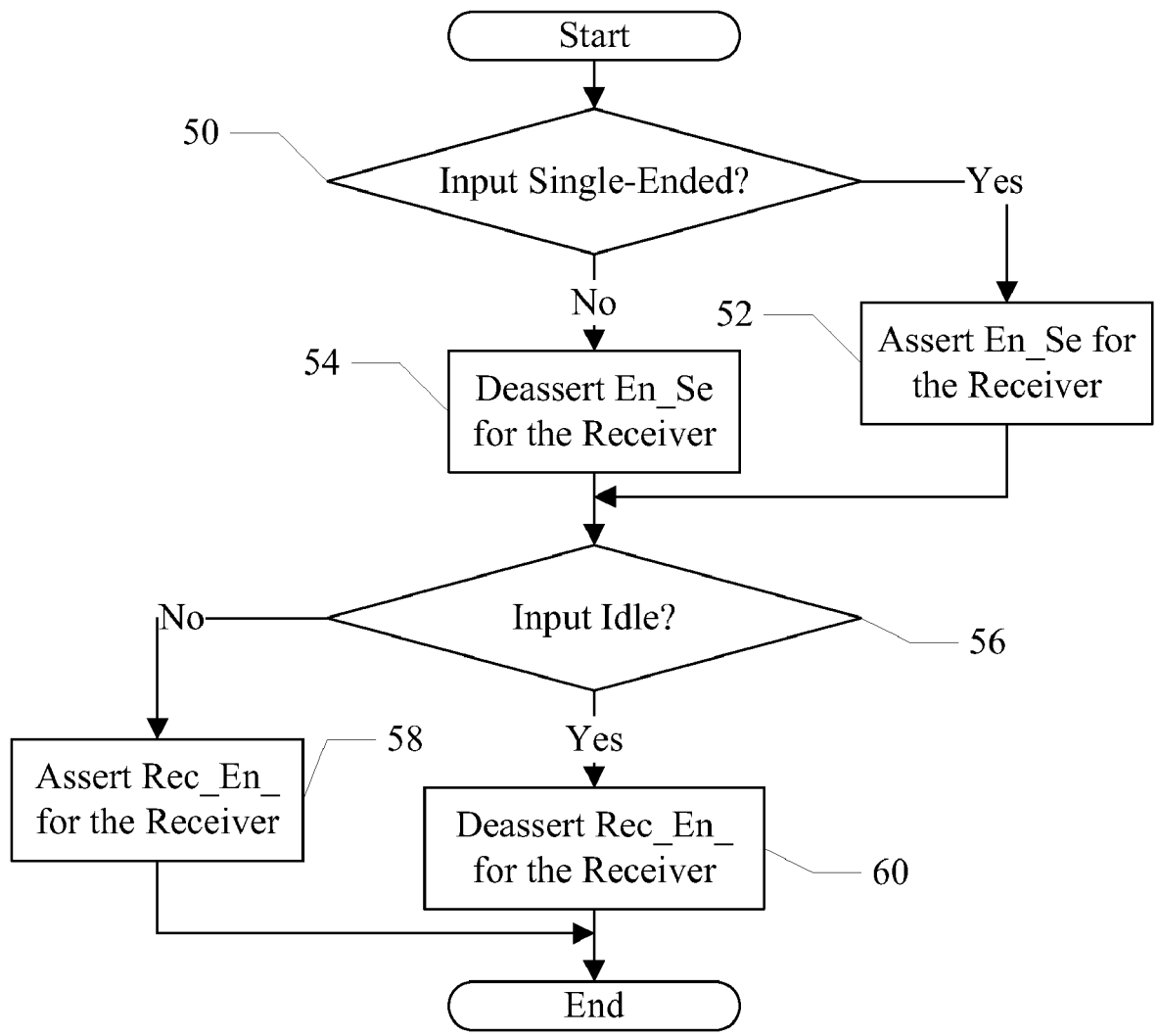
FIG. 3 is a flowchart illustrating exemplary operation of one embodiment of the integrated circuit shown in FIG. 1 using the receiver circuit shown in FIG. 2.

Turning now to FIG. 3, a flowchart is shown illustrating operation of one embodiment of the integrated circuit 10 using receiver circuits similar to the embodiment of FIG. 2. While the blocks are shown in a particular order for ease of understanding, other orders may be used. Blocks may be performed in parallel in combinatorial logic circuitry in the integrated circuit 10/receiver circuit 20. Blocks, combinations of blocks, and/or the flowchart as a whole may be pipelined over one or more clock cycles.

For each input, if the input is single-ended (decision block 50, "yes" leg), the En_Se signal to the corresponding receiver circuit may be asserted (block 52). If the input is differential, the En_Se signal to the corresponding receiver circuit may be deasserted (block 54).

The integrated circuit 10, and more specifically the memory controller 18, may determine input interface is idle (decision block 56). Generally, the input interface may be idle if there is no data to be received from the memory 12. For example, the memory 12 may have a known latency for read operations, and the memory controller 18 may be able to determine when data is ready to be read based on the latency and the previously issued read commands. The input interface may be idle otherwise. Alternatively, the memory controller 18 may determine that data will be received when a read command is transmitted, and may wait until all outstanding reads are complete before determining that there is no data to be received. If the input interface is not idle (decision block 56, "no" leg), the memory controller 18 may assert the Rec_En_signal to each receiver circuit 20 (block 58). If there input interface is idle (decision block 56, "yes" leg), the memory controller may deassert the Rec_En_signal to each receiver circuit 20 (block 60).

Numerous variations and modifications will become apparent to those skilled in the art once the above disclosure is fully appreciated. It is intended that the following claims be interpreted to embrace all such variations and modifications.

What is claimed is:

1. A receiver circuit comprising:
    an input stage coupled to receive a first input signal and a second input signal, wherein the input stage is configured to generate an output indicating whether or not the first input signal is greater than the second input signal;
    a first current source coupled to the input stage and configured to supply current to the input stage;
    a second current source coupled in parallel with the first current source and having an enable input, wherein the second current source is configured to supply current to the input stage responsive to an assertion of the enable input; and
    a bias circuit coupled to the first current source and the second current source, wherein the bias circuit is configured to provide a bias voltage to the first current source and the second current source to control a first amount of current supplied by the first current source and a second amount of current supplied by the second current source, wherein the bias circuit is coupled to receive a second enable signal and to generate the bias voltage responsive to an assertion of the second enable signal; and
    wherein each of the first current source and the second current source includes a first transistor having a gate terminal coupled to receive the bias voltage, and wherein the second current source comprises a second transistor coupled in series with the first transistor, wherein a gate of the second transistor is coupled to receive the enable signal to the second current source, and wherein the first current source comprises a corresponding transistor to the second transistor, the corresponding transistor coupled in series with the first transistor of the first current source and having a gate terminal coupled to a power supply voltage.

2. The receiver circuit as recited in claim 1 wherein the input stage comprises:
    a third transistor having a gate coupled to receive the first input signal, a source coupled to the first current source and the second current source;
    a fourth transistor having a drain coupled to a drain of the third transistor and a source coupled to a power supply conductor that is powered to a power supply voltage during use;
    a fifth transistor having a source coupled to the power supply conductor, a gate coupled to a gate of the fourth transistor, and a drain coupled to the gate of the fourth transistor; and
    a sixth transistor having a drain coupled to the drain of the fifth transistor, a gate coupled to receive the second input signal, and a source coupled to the first current source and the second current source.

3. The receiver circuit as recited in claim 1 wherein, in a differential mode, the first input signal and the second input signal are a differential pair corresponding to an input, and wherein the enable signal is deasserted in the differential mode, and wherein, in a single-ended mode, the first input signal is the input and the second input signal is a reference voltage for the input, and wherein the enable is asserted in the single-ended mode.

4. The receiver circuit as recited in claim 1 wherein the second current source is configured to provide a second amount of current that is about one third of a first amount of current that the first current source is configured to provide.

5. An integrated circuit comprising a plurality of receiver circuits coupled to receive a plurality of inputs forming an interface, wherein at least a first input of the plurality of inputs is a differential input represented by a differential pair of input signals, and wherein at least a second input of the plurality of inputs is a single-ended input represented by a first input signal referenced to a reference voltage, and wherein each of the plurality of receiver circuits includes an amplification stage that includes a first current source and a second current source coupled in parallel with the first current source, wherein the second current source is disabled in a first receiver circuit of the plurality of receiver circuits that is coupled to receive the first input, and wherein the second current source is enabled in a second receiver circuit of the plurality of receiver circuits that is coupled to receive the second input.

6. The integrated circuit as recited in claim 5 wherein the second current source is sized to provide additional current to approximately match a delay of the second input through the second receiver circuit to a delay of the first input through the first receiver circuit.

7. The integrated circuit as recited in claim 6 wherein one of the first input and the second input comprises a clock input and the other one of the first input and the second input is data referenced to the clock input.

8. The integrated circuit as recited in claim 7 further comprising a control circuit coupled to receive the data and capture the data responsive to the clock input.

9. The integrated circuit as recited in claim 5 wherein the interface comprises a memory interface to coupled the integrated circuit to memory.

10. A system comprising:
    a memory;

a memory interface that couples the memory to an integrated circuit; and the integrated circuit comprising a plurality of receiver circuits to couple to the memory interface, wherein the plurality of receiver circuits support both differential and single-ended signaling on the interface for signals received by the plurality of receiver circuits from the memory interface, wherein the plurality of receivers circuits are configured to supply corresponding signals to a memory controller within the integrated circuit responsive to the received signals, and wherein the plurality of receiver circuits each include an enable signal that is asserted if the receiver circuit is coupled to a single-ended input and that is deasserted if the receiver circuit is coupled to a differential input, and wherein the plurality of receiver circuits are configured to provide approximately a same delay for a differential input and a single-ended input responsive to the enable signal.

11. The system as recited in claim 10 wherein the memory interface includes a clock input and one or more data inputs, and wherein the clock input is differential and the data inputs are single-ended.

12. The system as recited in claim 10 wherein the memory interface includes a clock input and one or more data inputs, and wherein the clock input is single-ended and the data inputs are differential.

13. A system comprising:
a memory;
a memory interface that couples the memory to an integrated circuit; and
the integrated circuit comprising a plurality of receiver circuits to couple to the memory interface, wherein the plurality of receiver circuits support both differential and single-ended signaling on the interface, and wherein the plurality of receiver circuits each include an enable signal that is asserted if the receiver circuit is coupled to a single-ended input and that is deasserted if the receiver circuit is coupled to a differential input, and wherein the plurality of receiver circuits are configured to provide approximately a same delay for a differential input and a single-ended input, and wherein the plurality of receiver circuits further include a second enable signal, and wherein the integrated circuit is configured to deassert the second enable signal to disable the receiver circuits responsive to the memory interface being idle.

14. The system as recited in claim 10 wherein each of the plurality of receiver circuits comprises a first current source and a second current source coupled in parallel with the first current source, wherein the first current source and the second current source together control a gain of an amplifier in the receiver circuit, and wherein the second current source is controlled by the enable signal.

15. A method comprising:
configuring a plurality of receiver circuits in an integrated circuit to receive inputs from an interface, wherein each of the plurality of receiver circuits is configurable via an enable signal to receive either a single-ended input or a differential input, and wherein at least one of the plurality of receiver circuits is configured to receive the differential input and at least one other one of the plurality of receiver circuits is configured to receive the single-ended input, wherein the configuring comprises:
asserting the enable signal to each of the plurality of receiver circuits that receives a single-ended input;
deasserting the enable signal to each of the plurality of receiver circuits that receives a differential input;
providing a first delay for single-ended inputs by each of the plurality of receiver circuits that receives the asserted enable signal;
providing a second delay for differential inputs by each of the plurality of receiver circuits that receives the deasserted enable signal; and
the first delay is approximately the same as the second delay.

16. The method as recited in claim 15 wherein each of the plurality of receiver circuits comprises an amplifier stage comprising a first current source and a second current source in parallel with the first current source, wherein the second current source is controlled by the enable signal.

17. The method as recited in claim 15 further comprising: detecting that the interface is idle; and disabling each of the plurality of receiver circuits responsive to the detecting.

18. The system as recited in claim 13 wherein the memory interface includes a clock input and one or more data inputs, and wherein the clock input is differential and the data inputs are single-ended.

19. The system as recited in claim 13 wherein the memory interface includes a clock input and one or more data inputs, and wherein the clock input is single-ended and the data inputs are differential.

20. The system as recited in claim 13 wherein each of the plurality of receiver circuits comprises a first current source and a second current source coupled in parallel with the first current source, wherein the first current source and the second current source together control a gain of an amplifier in the receiver circuit, and wherein the second current source is controlled by the enable signal.

* * * * *

UNITED STATES PATENT AND TRADEMARK OFFICE
CERTIFICATE OF CORRECTION

| | | |
|---|---|---|
| PATENT NO. | : 7,961,007 B2 | Page 1 of 1 |
| APPLICATION NO. | : 12/433823 | |
| DATED | : June 14, 2011 | |
| INVENTOR(S) | : Gregory S. Scott et al. | |

It is certified that error appears in the above-identified patent and that said Letters Patent is hereby corrected as shown below:

In column 6, line 19, delete "covey" and insert -- convey --, therefor.

Signed and Sealed this
Third Day of January, 2012

David J. Kappos
*Director of the United States Patent and Trademark Office*